United States Patent [19]

Nadeau et al.

[11] 3,970,455

[45] July 20, 1976

[54] ELECTROSTATIC LITHOGRAPHIC PRINTING PROCESS UTILIZING HYDROPHILIZING COMPOSITION

[75] Inventors: Raymond R. Nadeau, Natick; John E. Wyman, Lexington, both of Mass.

[73] Assignee: Itek Corporation, Lexington, Mass.

[22] Filed: June 4, 1973

[21] Appl. No.: 366,953

[52] U.S. Cl. .......... 96/33; 96/1.8; 101/456; 101/451

[51] Int. Cl.[2] .......... G03F 7/02; G03G 5/08

[58] Field of Search .......... 96/1 R, 1.8, 33; 101/451, 465; 117/62, 17.5

[56] References Cited

UNITED STATES PATENTS

| | | | |
|---|---|---|---|
| 3,107,169 | 10/1963 | Borwarth | 96/33 |
| 3,230,081 | 1/1966 | Tomanek et al. | 96/33 |
| 3,309,990 | 3/1967 | Klupfel et al. | 96/1 R |
| 3,323,451 | 6/1967 | Casey et al. | 96/33 |
| 3,573,041 | 3/1971 | Van Engeland et al. | 96/33 |
| 3,617,266 | 11/1971 | Williams et al. | 96/33 |
| 3,672,885 | 6/1972 | Ort | 96/33 |
| 3,697,304 | 10/1972 | Uchida et al. | 96/33 |
| 3,717,464 | 2/1973 | Tandy | 96/33 |

*Primary Examiner*—Edward C. Kimlin
*Attorney, Agent, or Firm*—Homer O. Blair; Robert L. Nathans; David E. Brook

[57] ABSTRACT

A lithographic printing plate is produced by the steps of forming a latent electrostatic image on a photoconductive zinc oxide insulating layer and developing this layer with a toner which forms an imagewise deposit on the recording layer. Applicants' invention relates to contacting the portions of the recording layer which are not covered with the hydrophobic deposit with a hydrophilizing composition (commonly called a conversion wash) comprising the reaction product of (1) phosphoric acid or one of the anions derived from such acid, (2) an organic amine compound, and (3) a hydrophilic metal cation, to form a reaction product with zinc ions from the zinc oxide which reaction product of zinc ions with said composition is substantially insoluble in said composition and is preferentially wetted by water thereby repelling lithographic inks. The plate produced by this process is especially useful for use on a lithographic offset press to produce multiple copies of an original.

24 Claims, No Drawings

ELECTROSTATIC LITHOGRAPHIC PRINTING PROCESS UTILIZING HYDROPHILIZING COMPOSITION

BACKGROUND OF THE INVENTION

1. Field of the Invention

This invention relates to a photographic electrostatic process of making printing plates useful in the lithographic printing process, and to hydrophilizing compositions useful in this process.

2. Description of the Prior Art

Processes for producing lithographic printing plates by means of the electrophotographic process are well known in the art. The common way of producing such a printing plate is to first form an electrostatic plate having an oleophilic toner image deposited on a photoconductive layer such as zinc oxide deposited in an insulating resin binder by means of the electrophotographic process well known in the art. This thus formed electrophotographic plate is then converted into a lithographic printing plate by means of a hydrophilizing composition which is applied to the plate to convert the areas of the plate not containing the toner image to a more hydrophilic state. Numerous conversion baths have been disclosed in the prior art for such processes. See U.S. Pat. Nos. 3,573,041; 3,617,266; 3,001,872; 3,107,169; and 3,323,451, each of which is incorporated herein by reference. The most widely utilized commercial conversion wash is one containing ferrocyanide. Because of the toxic by-products this solution has serious disadvantages. This becomes especially critical as government regulations increasingly prohibit or restrict the use of such toxic materials.

A second lithographic printing plate which is in wide commercial use is the multilayer silver halide diffusion transfer printing plates described in U.S. Pat. No. 3,146,104, incorporated herein by reference. This plate is a camera speed printing plate which gives a somewhat higher quality print on the lithographic printing press than the electrostatic printing plate described above. Also the diffusion transfer printing plate has a somewhat longer run length generally than that of the electrostatic printing plate. Thus the diffusion transfer printing plate often is used for run lengths of 5,000 to 10,000 copies whereas an electrostatic printing plate generally has a run length of no greater than about 200 to 2,000 copies before serious degradation of the image or background occurs.

Many times in-plant printing facilities and in instant printing shops and the like, it is desirable to make both kinds of printing plates described above depending upon the quality and quantity of print desired by the customer. However, at the present time, one of the serious problems is that the printing plates of the two processes are not compatible on the same press under the same printing conditions. Thus a different fountain solution is needed for each of the two types of printing plates. Thus in order to eliminate the requirement of a separate printing press for each type of printing plate or to eliminate the need to undergo time consuming clean-up operations on the press to change from one type of printing plate to the other, it is desirable to provide an electrostatic lithographic printing plate which is compatible on the same press under the same conditions with the silver halide diffusion transfer plate described above.

SUMMARY OF THE INVENTION

This invention relates to a process for producing a lithographic printing plate comprising the steps of forming a latent electrostatic image on a photoconductive insulating recording layer comprising photoconductive zinc oxide, and developing this image with a toner forming an imagewise deposit on the recording layer and contacting the portions of the recording layer which are not covered with the hydrophobic toner deposit with a hydrophilizing composition comprising the reaction product of (1) phosphoric acid or one of the anions derived from such acid, (2) an organic amine compound, and (3) a hydrophilic metal cation, to form a reaction product with zinc ions from the zinc oxide which reaction product of zinc ions with this composition is substantially insoluble in the composition and is preferentially wetted by water to thereby repel lithographic inks. This thus prepared printing plate is then utilized on a lithographic press, preferably an offset press to produce multiple copies of the original. Preferably, the fountain solution is a diluted form of the hydrophilizing composition of this invention. The printing plate formed by the practice of this invention has the advantage that it can be run on the same press using the same ink and fountain solution as is used for the silver halide diffusion transfer printing plate described above. Furthermore, the electrostatic printing plates of this invention have been shown to wrinkle less in use on the press than prior art electrostatic printing plates thereby providing improved run lengths. Moreover, the conversion wash of this invention is applied to an electrostatic plate by a simple and fast process and eliminates the need for time consuming, messy, swabbing techniques utilized in many prior art processes. Additionally, a dilute solution of the conversion wash of this invention can be utilized as the fountain solution alone or combined with prior art fountain solutions on the lithographic offset press for both the electrostatic plate of this invention and the prior art silver halide diffusion transfer printing plate. This fountain solution has been shown to unexpectedly eliminate the blinding of the diffusion transfer plates by gum arabic. This is a significant advantage since gum arabic is commonly on contaminant of presses which use metal printing plates. Additionally, this same fountain solution can be utilized for diazo printing plates. Therefore, there are at least three different types of lithographic printing plates which can be utilized on the same printing press without the need for completely cleaning the press and changing the fountain solutions. An additional advantage of the conversion wash of this invention is that there is significantly greater stability to aerial oxidation than with prior art ferrocyanide conversion washes. Also this invention eliminates the need for the toxic ferrocyanide conversion washes and fountain solutions of the prior art.

DESCRIPTION OF THE PREFERRED EMBODIMENTS

The "phosphoric acid or one of the anions derived from such acid" includes metaphosphoric acid, metaphosphate ion, pyrophosphoric acid, pyrophosphate ion, dihydrogen orthophosphate ion, hydrogen orthophosphate ion, and/or orthophosphate ion and is preferably orthophosphoric acid or its derived anions because of the improved results obtained.

The hydrophilic metal cation of this invention is a cation which when added to the conversion wash improves the hydrophilicity of the background of the printing plate. It is theorized that this cation is adsorbed to the reaction product of the zinc cation from the photoconductive zinc oxide copy medium, the organic amine compound and the phosphoric acid or one of the anions derived from such acid. The metal cation preferably is aluminum cation. However, other cations such as those of titanium, zirconium or tin can be used.

The organic amine compound of this invention is an organic amine capable of forming an insoluble salt with zinc ion in combination with the hydrophilic metal cation and phosphoric acid to thereby increase the hydrophilicity of the background areas of the electrophotographic zinc oxide copy medium processed. The preferred amine is an alkylene amine such as diethylene triamine and more preferably a primary alkylene diamine such as ethylene diamine. Ethylene diamine is preferred because of the exceptionally good quality prints obtained with this amine compound. The preferred alkylene diamine is one having from 2–6 carbon atoms between the amine groups. The hydrophilizing composition of this invention is preferably an aqueous solution having a pH lower than 7 and more preferably between about 2 and about 5.

Optionally the hydrophilizing composition may contain mono or poly hydric alcohols such as ethyl alcohol, propyl alcohol, butyl alcohol, ethylene glycol, diethylene glycol, triethylene glycol, and sorbitol.

The hydrophilizing composition of this invention is preferably applied by dipping the imaged electrostatic recording medium in the solution and then removing excess solution from the surface of the sheet. Preferably, the excess solution is removed from the sheet by means of a pair of squeegee rollers. When utilized as a conversion wash for an electrophotographic zinc oxide plate, the hydrophilizing composition of this invention preferably is an aqueous solution of the following composition:

| | grams/ liter of solution |
|---|---|
| (1) phosphoric acid | 50–350 |
| (2) organic amine compound | 50–150 |
| (3) salt of hydrophilic metal cation | 10–250 |

When the hydrophilizing composition of this invention is utilized as a fountain solution, it may be utilized in the concentrated form or in a diluted form. If the composition is too concentrated, the background of the plate begins to break down and scumming occurs. On the other hand, if the fountain solution is too dilute, the background of the plate is not sufficiently wetted and scumming occurs. A preferred dilution of the hydrophilizing composition is from about 1 to 5 parts of this composition per 20 parts of water.

The preferred fountain solution of this invention is one comprising the composition of the conversion wash of this invention mixed with the fountain solution utilized for the silver halide diffusion transfer printing plate mentioned above. This silver halide diffusion transfer plate in the market place utilizes a fountain solution on the lithographic printing plate composed of alkylene glycol such as propylene or ethylene glycol combined with phosphoric acid in an aqueous solution. A preferred concentration of this combined fountain solution is from about 1 to 6 parts of the hydrophilizing solution to 20 parts of the diluted fountain solution utilized for the above-mentioned silver halide diffusion transfer printing plate.

The following examples illustrate this invention:

EXAMPLE 1

A conversion wash is prepared in accordance with the teachings of this invention by first preparing Solutions I and II as follows:

Solution I
- 250 grams of 85% $H_3PO_4$
- 150 grams $Al_2(SO_4)\cdot 18\ H_2O$
- water to 750 mls — cool to approximately 20°C Solution II
- 60 mls of 98% $H_2NCH_2CH_2NH_2$
- 100 mls $H_2O$ Solution II is added to Solution I while cooling and stirring. The pH is adjusted to 2.4 by adding sodium hydroxide. Water is then added to make up 1 liter of solution. This solution is then applied to an electrophotographic zinc oxide copy medium which had previously been imaged by electrophotographic means. The solution is applied by dipping the copy medium in the solution and then removing any excess by means of a rubber squeegee. The dwell time in the solution is about 1.0 to about 2.5 seconds. Thereafter the printing plate produced is mounted on the cylinder of a conventional lithographic duplicator such as Model 360 Offset Duplicator manufactured by A.B. Dick where the fountain solution is delivered to the plate over the ink roller. A fountain solution was prepared by adding one part of the fountain concentrate used with the silver halide diffusion transfer printing plate described in U.S. Pat. No. 3,146,104 and one part of the conversion wash to 15 parts of water. 2,000 good, clean copies of an original are produced.

EXAMPLE 2

The procedure of Example 1 is repeated except that the fountain solution was prepared by diluting one part of the conversion wash with nine parts of water. 1,000 good clean copies of an original are produced.

EXAMPLE 3

A test was devised to differentiate between amines which are useful in the practice of this invention and amines which are not. A solution of 50 grams of 85% orthophosphoric acid and 30 grams of $Al_2(SO_4)_3\cdot 18H_2O$ was dissolved in sufficient water to give a final volume of from 100 – 150 ml. The quantity of organic amine described in Table 1 was added with stirring and the pH was adjusted to 2.4 after the volume had been made up to 200 ml. with distilled water. A cotton swab was wetted with the solution and rubbed on an electrophotographic printing plate bearing an image, covering both imaged area and background area. Next, the swab was dipped in an offset printing ink such as Colitho All Purpose Black CO-1-C and rubbed over the area treated with the solution to see if the ink adheres to the imaged area or to the background or to both or to neither. The results of this test are described in Table 1. The control described in Table 1 utilized the composition described in Example 1.

The most promising compositions were used to treat electrostatic lithographic plates which were then run on an Itek Model 180 offset duplicator using Colitho All Purpose Black CO-1-C ink and the fountain solution described in Example 1. The results are described in Table 2 and the compositions referred to in Table 2 correspond to those described in Table 1.

TABLE 1

| Composition Number | Organic Amine, g. | Results |
|---|---|---|
| 1 | Control | Background rejects ink completely. Image accepts ink readily. |
| 2 | Triethyl Amine, 36.4 | Background accepts some ink. Image accepts ink readily. |
| 3 | Diethylene Triamine, 12.4 | Background rejects ink completely. Image accepts ink readily. |
| 4 | Methyl Amine, 29 g. of 40% solution in water | Background heavily inked. Image area rejected ink. |
| 5 | Dimethyl Amine, 64.8 g. of 25% solution in water | Background heavily inked. |

TABLE 2

| Composition Number | Results of Printing Tried |
|---|---|
| 1 | Image area dark black, background clean, halftones reproduced faithfully. |
| 2 | Some toning of the background occurred, image areas were dark black, halftones were slightly filled in. |
| 3 | Background very clean, as good as with composition 1. Image area is gray, not as black as composition 1 |
| 4 | Background accepted ink as readily as the image area and the plate scummed completely. |

EXAMPLE 4

A test was devised to identify hydrophilic metal cations which are useful in the practice of this invention. The following solutions were prepared:

Solution I
- 50 grams 85% $H_3PO_4$
- 12 ml 98% $H_2NCH_2CH_2NH_2$
- Water to 150 ml Solution II
- 8.0 grams $Ti(SO_4)_2 \cdot 9H_2O$
- Water to 50 ml Solution III
- 4.1 grams $SnSO_4$
- Water to 50 ml Solution IV
- 30 grams $Al_2(SO_4)_2 \cdot 18\,H_2O$
- Water to 50 ml The solutions were mixed as indicated in Example 1 and a cotton swab was wetted with the mixture and rubbed on an electrophotographic printing plate bearing an image, covering both the image area and the background. The cotton swab was then covered with an offset printing ink such as Colitho All Purpose Black CO-1-C and rubbed over the area treated with solution to see if the ink adheres to the image area or to the background or to both or to neither. The results of this test are described in Table 1. The control described in Table 1 utilized plain water only.

TABLE 1

| Composition Number | Mixture | Result |
|---|---|---|
| 1 | Control (plain water) | Both the background and the image area readily accepted ink and scummed heavily. |
| 2 | Solution I and Solution II | The background scummed slightly, less than the control, composition 1. |
| 3 | Solution I and Solution III | The background scummed less than composition 2, but still accepted some ink; the image area readily accepted ink. |
| 4 | Solution I and Solution IV | The background remained very clean. The image area accepted ink. Background cleaner than compositions 2 and 3. |

EXAMPLE 5

The procedure of Example 1 is repeated except that the treated plate was placed on an Itek 11·15 Duplicator (offset lithographic press) which is equipped with a molleton fountain system. 1,000 good clean copies of an original were produced.

EXAMPLE 6

A conversion wash is prepared with the following composition:

| | |
|---|---|
| 85% $H_3PO_4$ | 75 grams |
| Water | 600 ml. |
| 98% $H_2NCH_2CH_2NH_2$ to pH = 3.5 | |
| $Al_2(SO_4)_3 \cdot 18H_2O$ | 100 grams |
| $HOCH_2CH_2OCH_2CH_2OH$ | 125 ml. |
| NaOH to pH = 2.2 | |
| Water to 1 liter | |

This solution is then applied to an electrophotographic zinc oxide printing plate which had previously been imaged by electrophotographic means by rubbing it with a cotton swab which had been saturated with the solution. The plate was mounted on an Itek Model 180 tabletop offset lithographic duplicator. The fountain solution used was prepared by diluting one part of the fountain concentrate normally employed with the Itek Project-A-Lith silver halide diffusion transfer printing plate of U.S. Pat. No. 3,146,104 with 10 parts of water. 800 good, clean copies of an original were obtained.

EXAMPLE 7

A conversion wash is prepared with the following composition:

| | |
|---|---|
| 85% $H_3PO_4$ | 375 grams |
| Water | 1800 ml. |
| 98% $H_2NCH_2CH_2NH_2$ | to pH 3.5 |
| $Al_2(SO_4)_3 \cdot 18H_2O$ | 300 grams |
| $(HOCH_2CH_2)_2O$ | 375 ml |
| NaOH | to pH 2.2 |
| Water to | 3 liters |

This solution was applied to an electrophotographic zinc oxide printing plate which had been previously imaged by electrophotographic means by rubbing it with a cotton swab which had been saturated with the solution. The plate was mounted on an A.B. Dick Model 360 offset lithographic duplicator. A fountain solution was prepared by diluting one part of the conversion wash with ten parts of distilled water, and Itek ADS Ink, product code 40994, was used. 1,000 good, clean copies of an original were obtained.

EXAMPLE 8

The procedure of Example 7 was repeated except that the conversion wash was applied to the electrophotographic zinc oxide printing plate using a paint roller. Using the fountain solution and the ink described in Example 7, 1,000 good, clean copies of an original were obtained on an A.B. Dick Model 360 offset lithographic duplicator.

EXAMPLE 9

A fountain solution was prepared by diluting one part of the fountain concentrate normally employed with the silver halide diffusion transfer plate with 15 parts of water, then adding six parts of this solution to one part of the conversion wash described in Example 7. An electrophotographic zinc oxide printing plate which had been previously imaged by electrophotographic means was treated with the conversion wash described in Example 7 and was mounted on an Itek Model 180 tabletop offset lithographic duplicator charged with the above described fountain solution and Itek ADS Ink, product code 40994. 2,000 good, clean copies of an original were obtained.

EXAMPLE 10

An image was produced on an Itek Project-A-Lith silver halide diffusion transfer plate prepared by the process of U.S. Pat. No. 3,146,104, referred to as a PAL plate, and it was mounted on the Itek Model 180 tabletop offset lithographic duplicator charged with the ink and fountain solution described in Example 9. 5,000 good, clean copies of an original were obtained.

EXAMPLE 11

An Itek 11·15 offset lithographic duplicator press was charged with the ink and fountain solutions described in Example 9 and a silver halide diffusion transfer plate prepared as described in Example 10 was mounted. 5,000 good, clean copies of an original were obtained.

EXAMPLE 12

An Itek 11·15 offset lithographic duplicator press was charged with the ink and fountain solution described in Example 9. An electrophotographic zinc oxide printing plate which had been previously imaged by electrophotographc means was treated with the conversion wash as described in Example 7 was mounted. 1,000 good, clean copies of an original were obtained.

EXAMPLE 13

An Itek 11·15 offset duplicator was charged with GPI Split-Sec Black Ink and the fountain solution described in Example 9. An aluminum metal plate with a diazo coating sold by Minnesota Mining and Manufacturing Co. as the 3M-R plate was exposed imagewise to light and developed. This plate was mounted on the duplicator and 5,000 good, clean copies of an original were obtained.

EXAMPLE 14

A conversion wash is prepared with the following composition:

| | |
|---|---|
| 85% $H_3PO_4$ | 250 grams |
| 98% $H_2NCH_2CH_2NH_2$ | 60 ml. |
| $Al_2(SO_4)_3 \cdot 18H_2O$ | 150 grams |
| $CH_3CH_2OH$ | 100 ml. |
| Water to | 1 liter |
| NaOH | to pH 2.2 |

This solution is then applied to an electrophotographic zinc oxide printing plate which had previously been imaged by electrophotographic means. The solution is applied by dipping the copy medium in the solution and then removing any excess by means of a rubber squeegee. The dwell time in the solution is about 2.5 seconds. Thereafter the printing plate produced is mounted on the cylinder of an Itek Model 180 Tabletop Duplicator offset lithographic press. The duplicator is charged with Itek ADS Ink, Product Code 40994, and a fountain solution prepared by diluting one part of the conversion wash with 10 parts of water. 1,000 good clean copies of an original were obtained.

EXAMPLE 15

An Itek Project-A-Lith silver halide diffusion transfer printing plate prepared by the procedure of U.S. Pat. No. 3,146,104 bearing an image was mounted on an Itek Model 180 tabletop duplicator offset lithographic press charged with the ink and fountain solution described in Example 14. 5,000 good clean copies of an original were obtained.

EXAMPLE 16

A line copy original with a grey scale paste up was placed on the copy board of an Itek Model 175 Electrostatic Platemaker. Two exposures were made, one for 25 seconds at a lens setting at f 16 and a second for 12 seconds at a lens setting at f 11. Both plates were treated by immersing them in the conversion wash described in Example 1 and the excess was removed by squeegeeing. The dwell time in the solution was about 2.5 seconds. The plates were mounted separately on an A.B. Dick Model 360 offset duplicator charged with Itek ADS ink and the fountain solution described in Example 1. 500 good, clean copies of the original were obtained, and in both cases the same number of solid steps on the grey scale step wedge were printed. This kind of exposure latitude is not possible using conventional ferrocyanide conversion washes as is evidenced by the fact that any variation from a 15 second exposure at a lens setting of f 16. This example thus shows the unexpectedly improved exposure latitude using the conversion wash of this invention in an electrophotographic proces for preparing lithographic printing plates.

We claim:

1. In a process for producing a lithographic printing plate comprising the steps of forming a latent electrostatic image on a photoconductive insulating recording layer comprising photoconductive zinc oxide, and developing this image with a hydrophobic toner forming an imagewise deposit on the recording layer, the improvement of contacting the portions of the recording layer which are not covered with the hydrophobic deposit with a hydrophilizing composition comprising a first reaction product of (1) phosphoric acid or one of the anions derived from such acid, (2) an organic alkylene amine compound, and (3) a hydrophilic metal cation selected from the group consisting of aluminum, titanium, zirconium and tin cations, to form a second reaction product with zinc ions from the zinc oxide which second reaction product of zinc ions with said hydrophilizing composition is substantially insoluble in said hydrophilizing composition and is wetted by water thereby repelling lithographic inks wherein said second reaction product is an insoluble salt containing zinc ions, phosphoric acid or one of the anions derived from such acid, an organic amine compound, and said hydrophilic metal cation.

2. Improvement as in claim 1 wherein the phosphoric acid comprises orthophosphoric acid.

3. Improvement as in claim 1 wherein the organic amine is an alkylene diamine having from 2–6 carbon atoms between the amine groups.

4. Improvement as in claim 2 wherein the organic amine comprises ethylene diamine.

5. Improvement as in claim 1 wherein the hydrophilic metal cation comprises an aluminum cation.

6. Improvement as in claim 4 wherein the hydrophilic metal cation comprises aluminum cation.

7. Improvement as in claim 6 wherein the aluminum cation is provided by aluminum sulfate.

8. Improvement as in claim 1 wherein the pH of the hydrophilizing composition is lower than 7.

9. Improvement as in claim 6 wherein the pH of the hydrophilizing composition is lower than 7.

10. Improvement as in claim 6 wherein the pH of the hydrophilizing composition is between about 2 and about 5.

11. Improvement as in claim 6 wherein the hydrophilizing composition is applied by dipping the imaged recording layer in the solution and then removing excess composition from the surface of the sheet.

12. Improvement as in claim 11 wherein the excess hydrophilizing composition is removed from the sheet by means of a pair of squeegee rollers.

13. In a process of lithographic printing comprising the steps of forming a latent electrostatic image on a photoconductive insulating recording layer comprising photoconductive zinc oxide, developing said image with a toner forming an imagewise hydrophobic deposit on the recording layer, contacting the thus imaged plate with a hydrophilizing solution to increase the hydrophilicity of the non-image areas of the recording layer, and utilizing this thus prepared layer as a printing plate on a lithographic press to produce multiple copies, the improvement wherein the hydrophilizing solution comprises a first reaction product of (1) phosphoric acid or one of the anions derived from such acid, (2) an organic alkylene amine compound, and (3) a hydrophilic metal cation selected from the group consisting of aluminum, titanium, zirconium and tin cations which hydrophilizing solution reacts with zinc ion from the zinc oxide to form a second reaction product in the form of a hydrophilic layer in the non-image areas of the recording layer which is adherently bonded to said recording layer, is substantially insoluble in said solution and is wetted by water thereby repelling lithographic inks wherein said second reaction product is an insoluble salt containing zinc ions, phosphoric acid or one of the anions derived from such acid, an organic amine compound, and said hydrophilic metal cation.

14. Improvement as in claim 13 wherein the hydrophilizing solution comprises phosphoric acid, etnylene diamine, and aluminum cation.

15. Improvement as in claim 13 wherein the hydrophilizing solution has a pH lower than 7.

16. Improvement as in claim 14 wherein the hydrophilizing solution has a pH of between about 2 and about 5.

17. Improvement as in claim 13 wherein the hydrophilizing solution is applied by dipping the sheet in the solution and then removing excess solution from the surface of the sheet.

18. Improvement as in claim 17 wherein the removal of excess solution from the sheet is performed by means of a pair of squeegee rollers.

19. Improvement as in claim 13 wherein the lithographic press applies an aqueous fountain solution comprising the reaction product of (1) phosphoric acid or one of the anions derived from this acid, (2) an organic amine compound, and (3) a hydrophilic metal cation selected from the group consisting of aluminum, titanium, zirconium and tin cations.

20. Improvement as in claim 19 wherein the fountain solution comprises orthophosphoric acid, ethylene diamine and aluminum cations.

21. Improvement as in claim 19 wherein the pH of the fountain solution is less than 7.

22. Improvement as in claim 20 wherein the pH is between about 2 and about 5.

23. Improvement as in claim 21 wherein the fountain solution additionally comprises a dilute aqueous solution of alkylene glycol and phosphoric acid.

24. Improvement as in claim 23 wherein the fountain solution comprises the reaction product of phosphoric acid, ethylene diamine, and aluminum cations.

* * * * *